(12) United States Patent
Iizumi et al.

(10) Patent No.: US 8,017,253 B2
(45) Date of Patent: Sep. 13, 2011

(54) ORGANIC ELECTROLUMINESCENT ELEMENT AND PHOTOCATALYST CONTAINING COATING SOLUTION FOR ORGANIC ELECTROLUMINESCENT ELEMENT

(75) Inventors: Yasuhiro Iizumi, Tokyo (JP); Kiyoshi Itoh, Tokyo (JP); Yoshihiro Kobayashi, Tokyo (JP); Norihito Ito, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 812 days.

(21) Appl. No.: 11/520,195

(22) Filed: Sep. 13, 2006

(65) Prior Publication Data

US 2007/0059555 A1    Mar. 15, 2007

(30) Foreign Application Priority Data

Sep. 14, 2005  (JP) .................................. 2005-266656

(51) Int. Cl.
*H32B 19/00*  (2006.01)
(52) U.S. Cl. ....................................................... 428/690
(58) Field of Classification Search .................... 257/40; 428/690; 313/504, 50
See application file for complete search history.

(56) References Cited

U.S. PATENT DOCUMENTS 5,225,495 A * 7/1993 Han et al. .................... 525/327.4
7,115,351 B2 * 10/2006 Kishimoto .................... 430/199

2001/0022497 A1   9/2001 Aoki et al.
2002/0076576 A1 * 6/2002 Li et al. .......................... 428/690
2006/0006373 A1 * 1/2006 Kobayashi et al. ............... 257/1

FOREIGN PATENT DOCUMENTS

| JP | J2000-223270 | 8/2000 |
| JP | 2002-15867 A | 1/2002 |
| JP | 2004-002176 A | 1/2004 |

* cited by examiner

*Primary Examiner* — Angela Ortiz
*Assistant Examiner* — J. L. Yang
(74) *Attorney, Agent, or Firm* — Ladas & Parry LLP

(57) ABSTRACT

A main object of the present invention is to provide an organic EL element having members such as an organic EL layer formed highly precisely in a pattern with preferable light emission characteristic of the organic EL layer, and a photocatalyst containing coating solution to be used for the production thereof. To achieve the object, the present invention provides an organic electroluminescent element comprising: a substrate; a first electrode layer formed on the substrate; an organic electroluminescent layer formed on the first electrode layer; and a second electrode layer formed on the organic electroluminescent layer, wherein a photocatalyst containing layer containing a photocatalyst, a characteristic providing agent, and a light emission characteristic improving material having the function of improving the activation of the photocatalyst and the light emission characteristic of the organic electroluminescent layer so as to have the characteristic of the characteristic providing agent changed by the action of the photocatalyst accompanied by the energy irradiation is formed at any position between the substrate and the second electrode layer; and the light emission characteristic improving material is a silver salt of a fluorine or an acid selected from the group consisting of carboxylic acids, sulfonic acids, sulfinic acids, phenols, enols, thiophenols, imides, oximes, primary or secondary nitro compounds, clathrate compounds, a chloric acid and a perchloric acid.

2 Claims, 3 Drawing Sheets

FIG. 1
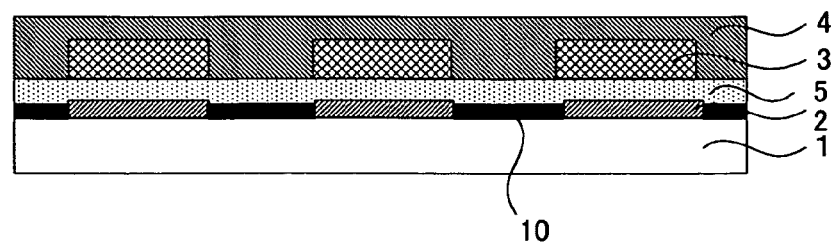
FIG. 2
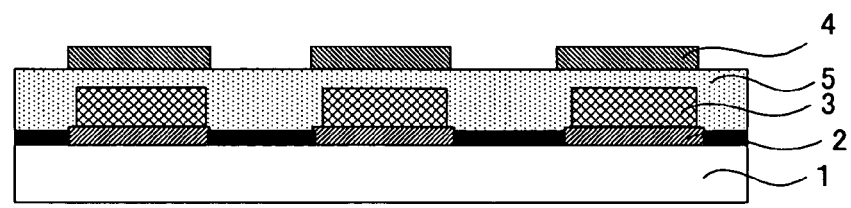
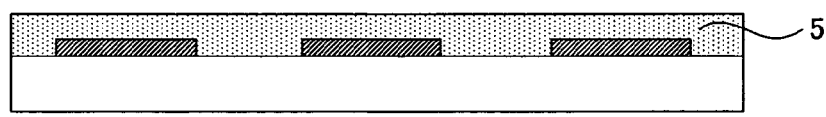
FIG. 3A
FIG. 3B
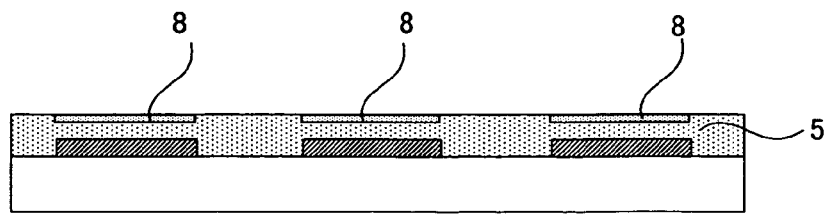

ORGANIC ELECTROLUMINESCENT ELEMENT AND PHOTOCATALYST CONTAINING COATING SOLUTION FOR ORGANIC ELECTROLUMINESCENT ELEMENT

BACKGROUND OF THE INVENTION

1. Field of the Invention

The present invention relates to an organic electroluminescent element used preferably for various kinds of displays, light emitting elements, or the like, and a photocatalyst containing coating solution for an organic electroluminescent element used for the production thereof.

2. Description of the Related Art

Conventionally, in the method for manufacturing an organic electroluminescent (hereinafter it is also referred to as "organic EL") element, an organic EL layer, an electrode layer, or the like have been formed by such as the photolithography method, the mask deposition method. However, the photolithography method involves a problem of the process complication and the high cost, while as the mask deposition method, requiring an expensive vacuum device, is problematic in terms of the yield and the cost.

Recently, a method of using a photocatalyst has been proposed as a method for patterning the organic EL layer and the electrode layer (see Japanese Patent Application Laid-Open (JP-A) No. 2000-223270). Specifically, by forming a photocatalyst containing layer to have the surface characteristic change by the action of the photocatalyst accompanied by the energy irradiation, and directing an energy in a pattern to the photocatalyst containing layer surface, patterns with different characteristics are formed on the photocatalyst containing layer surface. Thereafter, utilizing the characteristic difference of the characteristic changeable patterns formed on the photocatalyst containing layer, the organic EL layer, the electrode layer, or the like are patterned. According to the method, the organic EL layer, the electrode layer, or the like can be formed highly precisely, utilizing the above-mentioned characteristic difference so that the labor needed for patterning can be dramatically saved. However, in the case the activation of the above-mentioned photocatalyst is low, the pattern formation of the characteristic changeable takes time so as to cause the energy spreading around or the like. As a result, the pattern to be formed is made thick to cause a problem that the organic EL layer, the electrode layer, or the like can hardly be formed highly precisely. Furthermore, depending on the kind of the above-mentioned photocatalyst containing layer, the light emission characteristic of the organic EL element is lowered, and thus it is problematic.

SUMMARY OF THE INVENTION

Therefore, an organic EL element having members such as an organic EL layer formed highly precisely in a pattern with preferable light emission characteristic of the organic EL layer, and a photocatalyst containing coating solution to be used for the production thereof are called for.

The present invention provides an organic electroluminescent element comprising: a substrate; a first electrode layer formed on the base material; an organic electroluminescent layer formed on the first electrode layer; and a second electrode layer formed on the organic electroluminescent layer, wherein a photocatalyst containing layer containing a photocatalyst, a characteristic providing agent, and a light emission characteristic improving material having a function of improving an activation of the photocatalyst and a light emission characteristic of the organic electroluminescent layer so as to have the characteristic of the characteristic providing agent changed by an action of the photocatalyst accompanied by the energy irradiation is formed at any position between the substrate and the second electrode layer; and the light emission characteristic improving material is a silver salt of a fluorine or an acid selected from the group consisting of carboxylic acids, sulfonic acids, sulfinic acids, phenols, enols, thiophenols, imides, oximes, primary or secondary nitro compounds, clathrate compounds, a chloric acid and a perchloric acid.

According to the present invention, since the above-mentioned photocatalyst containing layer is formed, by utilizing the characteristic of the photocatalyst containing layer, for example, the organic EL layer, and each electrode layer can be formed. Moreover, since the light emission characteristic improving material is contained in the photocatalyst containing layer, the light emission characteristic of the above-mentioned organic EL layer can be provided preferably so that a high quality organic EL element with a high light emitting efficiency can be provided. Furthermore, since the light emission characteristic improving material is contained in the photocatalyst containing layer, the sensitivity of the photocatalyst can be made high so that a photocatalyst containing layer with a pattern having the characteristic changed highly precisely can be provided without the influence of the energy spreading around, or the like. Therefore, according to the present invention, the above-mentioned organic EL layer, the second electrode layer, or the like are formed as a highly precise pattern on the photocatalyst containing layer, and thus it is advantageous.

The present invention further provides a photocatalyst containing coating solution for forming an organic electroluminescent element containing: a photocatalyst, a characteristic providing agent; and a light emission characteristic improving material having a function of improving an activation of the photocatalyst and a light emission characteristic of the organic electroluminescent layer, wherein the light emission characteristic improving material is a silver salt of a fluorine or an acid selected from the group consisting of carboxylic acids, sulfonic acids, sulfinic acids, phenols, enols, thiophenols, imides, oximes, primary or secondary nitro compounds, clathrate compounds, a chloric acid and a perchloric acid.

According to the present invention, since the photocatalyst containing coating solution for forming an organic EL element contains the above-mentioned light emission characteristic improving material, at the time of forming the photocatalyst containing layer using the photocatalyst containing coating solution for forming an organic EL element, the activation of the photocatalyst can be made high. Moreover, in the case of manufacturing the organic EL element utilizing the characteristic of the photocatalyst containing layer, the light emission characteristic of the organic EL layer can be made preferable, and thus it is advantageous.

According to the present invention, utilizing the characteristic of the above-mentioned photocatalyst containing layer, for example, the organic EL layer, each electrode layer, or the like can be formed as a highly precise pattern. Moreover, according to the present invention, the effect of providing the light emission characteristic of the organic EL layer preferably can also be achieved.

BRIEF DESCRIPTION OF THE DRAWINGS

FIG. 1 is a schematic cross-sectional view showing an example of an organic EL element of the present invention;

FIG. 2 is a schematic cross-sectional view showing another example of an organic EL element of the present invention;

FIGS. 3A and 3B is an explanatory diagram showing an example of a method for patterning a photocatalyst containing layer used for the present invention;

DETAILED DESCRIPTION OF THE INVENTION

Figure 4:
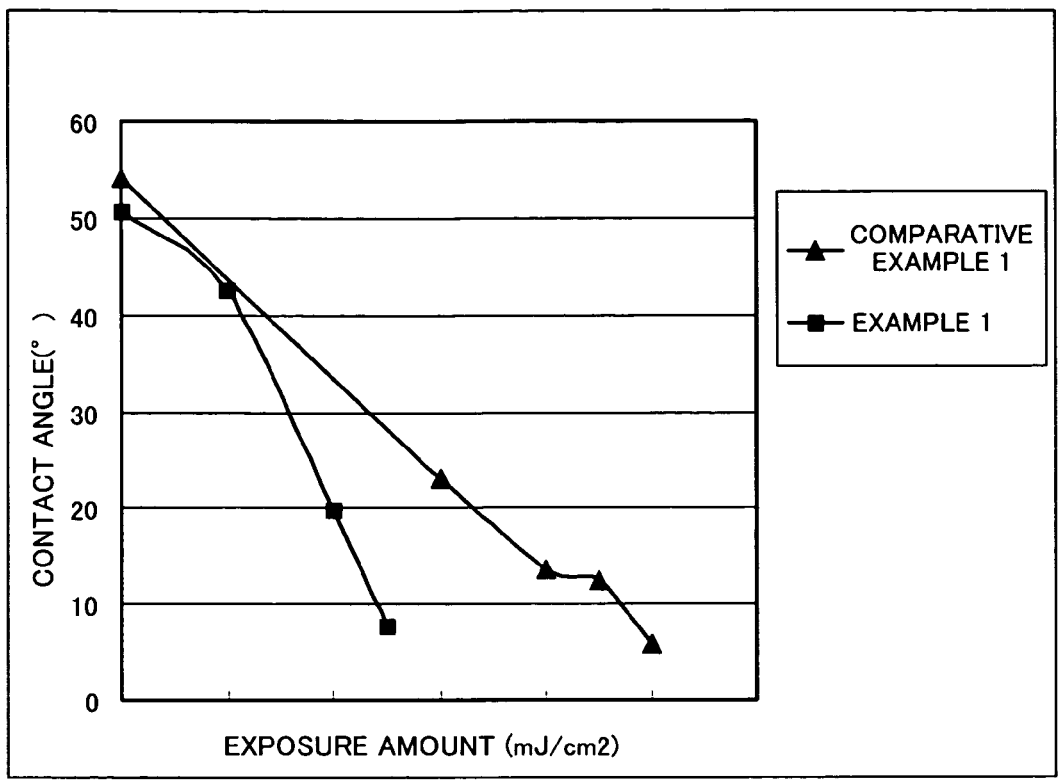
FIG. 4 is a graph showing the relationship between the accumulated energy amount and the contact angle with respect to a xylene in a region with the energy irradiated in the example 1 and the comparative example 1 of the present invention.

The present invention relates to an organic electroluminescent element used preferably for various kinds of displays, light emitting elements, or the like, and a photocatalyst containing coating solution for an organic electroluminescent element used for the production thereof.

Hereinafter, each element will be explained.

A. Photocatalyst Containing Coating Solution for an Organic EL Element

First, a photocatalyst containing coating solution for an organic EL element of the present invention will be explained. The photocatalyst containing coating solution for an organic EL element of the present invention contains: a photocatalyst, a characteristic providing agent; and a light emission characteristic improving material having the function of improving the activation of the photocatalyst and the light emission characteristic of the organic electroluminescent layer, wherein the light emission characteristic improving material is a silver salt of a fluorine or an acid selected from the group consisting of carboxylic acids, sulfonic acids, sulfinic acids, phenols, enols, thiophenols, imides, oximes, primary or secondary nitro compounds, a chloric acid and a perchloric acid.

Since the photocatalyst containing coating solution for an organic EL element of the present invention is used at the time of forming an organic EL element, and in general it is used for patterning the organic EL layer, each electrode layer, or the like of the organic EL element.

According to the present invention, since the photocatalyst and the characteristic providing agent are contained in the photocatalyst containing coating solution for an organic EL element, the photocatalyst containing layer formed by using the photocatalyst containing coating solution for an organic EL element can be provided as a layer to have the characteristic change by the energy irradiation. Moreover, in the present invention, since the above-mentioned light emission characteristic improving material is contained in the photocatalyst containing coating solution for an organic EL element together with the photocatalyst, the sensitivity of the photocatalyst can be improved by the action of the light emission characteristic improving material. Thereby, the sensitivity of the photocatalyst containing layer formed by coating the photocatalyst containing coating solution for an organic EL element can be made high so that a pattern with the characteristic changed can be formed efficiently on the photocatalyst containing layer in a short time.

Furthermore, in the present invention, the light emission characteristic improving material is contained in the photocatalyst containing coating solution for an organic EL element. Therefore, in the case of forming a photocatalyst containing layer using the photocatalyst containing coating solution for an organic EL element, the light emission characteristic of the organic EL layer of the organic EL element can be provided preferably, and thus it is advantageous. Hereinafter, each material contained in the photocatalyst containing coating solution for an organic EL element of the present invention will be explained in detail.

1. Light Emission Characteristic Improving Material

First, the light emission characteristic improving material used in the present invention will be explained. The light emission characteristic improving material used in the present invention is for improving the activation of the photocatalyst to be described later, and further has the function of improving the light emission characteristic of the organic EL layer at the time of using the photocatalyst containing layer formed by using the photocatalyst containing coating solution for an organic EL element of the present invention for an organic EL element. To "improve the light emission characteristic of the organic EL layer" refers to the improvement of the illuminance at the time of applying a voltage to the organic EL element, improvement of the illuminance at the same current value, and lowering the light emission starting voltage.

In the present invention, as the light emission characteristic improving material, a silver salt of an organic acid such as carboxylic acids, sulfonic acids, sulfinic acids, phenols, enols, thiophenols, imides, oximes, primary or secondary nitro compounds or clathrate compounds, or a silver salt of an inorganic acid such as a chloric acid, a perchloric acid or a fluorine can be used.

As the above-mentioned carboxylic acids, those of a chemical formula RCOOH, wherein R is an alkyl group having 1 to 20 carbon atoms, an alkoxy group, an alkylthio group, an alkoxy alkyl group having 2 to 20 carbon atoms, an alkylthio alkyl group, an alkenyl group, a cycloalkyl group having 5 to 20 carbon atoms, an aryl group having 6 to 20 carbon atoms, an alkaryl group having 7 to 20 carbon atoms, or an aralkyl group can be used. Moreover, those having R as a heterocyclic group such as a pyrridyl group, a quinoryl group, a flanyl group, a pyrrolyl group and a thienyl group, or a halogen atom, a nitro group, a cyano group, an epoxy group, a hydrogen group, or the like can also be presented. Specifically, a formic acid, an acetic acid, an oxalic acid, a tartaric acid, a propionic acid, a butyric acid, a malic acid, a citric acid, a sorbic acid, a fumaric acid, a maleic acid, an acrylic acid, a polyacrylic acid, a benxoic acid, or the like can be presented.

Moreover, as the above-mentioned sulfonic acids, those of a chemical formula $RSO_3H$, wherein R is an alkyl group having 1 to 20 carbon atoms, an alkoxy group, an alkylthio group, an alkoxy alkyl group having 2 to 20 carbon atoms, an alkylthio alkyl group, an alkenyl group, a cycloalkyl group having 5 to 20 carbon atoms, an aryl group having 6 to 20 carbon atoms, an alkaryl group having 7 to 20 carbon atoms, or an aralkyl group can be used. Moreover, those having R as a heterocyclic group such as a pyrridyl group, a quinoryl group, a flanyl group, a pyrrolyl group and a thienyl group, or a halogen atom, a nitro group, a cyano group, an epoxy group, or the like can also be presented. Specifically, a benzene sulfonic acid, a paratoluene sulfonic acid, a camphorsulfonic acid, or the like can be presented. Moreover, sulfonated polystyrenes, sulfonated polyethylenes, sulfonated polycarbonates or the like can also be presented.

As the above-mentioned sulfinic acids, those of a chemical formula $RSO_2H$, wherein R is an alkyl group having 1 to 20 carbon atoms, an alkoxy group, an alkylthio group, an alkoxy alkyl group having 2 to 20 carbon atoms, an alkylthio alkyl group, an alkenyl group, a cycloalkyl group having 5 to 20 carbon atoms, an aryl group having 6 to 20 carbon atoms, an alkaryl group having 7 to 20 carbon atoms, or an aralkyl group can be used. Moreover, those having R as a heterocyclic group such as a pyrridyl group, a quinoryl group, a flanyl group, a pyrrolyl group and a thienyl group, or a halogen atom, a nitro group, a cyano group, an epoxy group can be presented. Specifically, a toluene sulfinic acid, abenzene sulfinic acid, a methyl sulfinic acid, an ethyl sulfinic acid or the like can be presented.

As the above-mentioned phenols, those of a chemical formula $R_n(C_6H_{(5-n)})OH$, wherein R is an alkyl group having 1 to 20 carbon atoms, an alkoxy group, an alkylthio group, an alkoxy alkyl group having 2 to 20 carbon atoms, an alkylthio alkyl group, an alkenyl group, a cycloalkyl group having 5 to 20 carbon atoms, an aryl group having 6 to 20 carbon atoms, an alkaryl group having 7 to 20 carbon atoms, or an aralkyl group can be used. Moreover, those having R as a heterocyclic group such as a pyrridyl group, a quinoryl group, a flanyl group, a pyrrolyl group and a thienyl group, or a halogen atom, a nitro group, a cyano group, an epoxy group or the like can also be presented. Moreover, n is an integer from 0 to 5. As the above-mentioned phenols, specifically, a phenol, a cresol or the like can be presented.

As the above-mentioned enols, those of a chemical formula $RCH=C(OH)R'$, wherein R or R' is an alkyl group having 1 to 20 carbon atoms, an alkoxy group, an alkylthio group, an alkoxy alkyl group having 2 to 20 carbon atoms, an alkylthio alkyl group, an alkenyl group, a cycloalkyl group having 5 to 20 carbon atoms, an aryl group having 6 to 20 carbon atoms, an alkaryl group having 7 to 20 carbon atoms, or an aralkyl group can be used. Moreover, those having R as a heterocyclic group such as a pyrridyl group, a quinoryl group, a flanyl group, a pyrrolyl group and a thienyl group, or a halogen atom, a nitro group, a cyano group, an epoxy group, a hydrogen group or the like can also be presented. Moreover, the above-mentioned enol may be of a diketone. Specifically, an ethyl phenyl diketone, an acetyl acetone, or the like can be presented.

Moreover, as the thiophenols, those of a chemical formula $R_n(C_6H_{(5-n)})SH$, wherein R is an alkyl group having 1 to 20 carbon atoms, an alkoxy group, an alkylthio group, an alkoxy alkyl group having 2 to 20 carbon atoms, an alkylthio alkyl group, an alkenyl group, a cycloalkyl group having 5 to 20 carbon atoms, an aryl group having 6 to 20 carbon atoms, an alkaryl group having 7 to 20 carbon atoms, or an aralkyl group can be used. Moreover, those having R as a heterocyclic group such as a pyrridyl group, a quinoryl group, a flanyl group, a pyrrolyl group and a thienyl group, or a halogen atom, a nitro group, a cyano group, an epoxy group or the like can also be presented. Moreover, n is an integer from 0 to 5. Specifically, a thiophenol, a dimethyl thiophenol or the like can be presented.

Moreover, as the imides, those of a chemical formula $RCONHCOR'$, wherein R or R' is an alkyl group having 1 to 20 carbon atoms, an alkoxy group, an alkylthio group, an alkoxy alkyl group having 2 to 20 carbon atoms, an alkylthio alkyl group, an alkenyl group, a cycloalkyl group having 5 to 20 carbon atoms, an aryl group having 6 to 20 carbon atoms, an alkaryl group having 7 to 20 carbon atoms, or an aralkyl group can be used. Moreover, those having R or R' as a heterocyclic group such as a pyrridyl group, a quinoryl group, a flanyl group, a pyrrolyl group and a thienyl group, or a halogen atom, a nitro group, a cyano group, an epoxy group, a hydrogen group or the like can also be presented. Specifically, a phthalimide, a maleimide or the like can be presented.

Moreover, as the oximes, those of a chemical formula $RCH=NOH$, wherein R is an alkyl group having 1 to 20 carbon atoms, an alkoxy group, or an alkylthio group, an alkoxy alkyl group having 2 to 20 carbon atoms, an alkylthio alkyl group, an alkenyl group, a cycloalkyl group having 5 to 20 carbon atoms, an aryl group having 6 to 20 carbon atoms, an alkaryl group having 7 to 20 carbon atoms, or an aralkyl group can be used. Moreover, those having R or R' as a heterocyclic group such as a pyrridyl group, a quinoryl group, a flanyl group, a pyrrolyl group and a thienyl group, or a halogen atom, a nitro group, a cyano group, an epoxy group, a hydrogen group or the like can also be presented. Specifically, a benzophenone oxime, a formaldehyde oxime or the like can be presented.

Moreover, as the above-mentioned primary or secondary nitro compounds, those of a chemical formula $RCH_2NO_2$, or $R_2CHNO_2$, wherein R is an alkyl group having 1 to 20 carbon atoms, an alkoxy group, or an alkylthio group, an alkoxy alkyl group having 2 to 20 carbon atoms, an alkylthio alkyl group, an alkenyl group, a cycloalkyl group having 5 to 20 carbon atoms, an aryl group having 6 to 20 carbon atoms, an alkaryl group having 7 to 20 carbon atoms, or an aralkyl group can be used. Moreover, those having R or R' as a heterocyclic group such as a pyrridyl group, a quinoryl group, a flanyl group, a pyrrolyl group and a thienyl group, or a halogen atom, a nitro group, a cyano group, an epoxy group, a hydrogen group or the like can also be presented. Specifically, a nitro propane, a nitro cellulose, or the like can be presented.

Furthermore, as the clathrate compounds, specifically, Calyx allenes, thia Calyx allenes, crown ethers, chalcones, or the like can be presented.

In the present invention, among the above-mentioned, it is preferable to use a silver salt of the carboxylic acids, the sulfonicacids, the enols, the thiophenols, a fluorine, a chloric acid or a perchloric acid. It is particularly preferable to use a silver acetate, a silver camphorsulfonic acid, a silver acetyl acetonate complex, a silver mercaptide, a silver fluoride, a silver chlorate, or a silver perchlorate. Thereby, the sensitivity of the photocatalyst, and the light emission characteristic of the organic EL layer can dramatically be improved.

It is preferable that the light emission improving material is contained in the solid component of the photocatalyst containing coating solution for an organic EL element in a range of 0.0001% by mass to 70% by mass, more preferably in a range of 0.001% by mass to 50% by mass, and particularly preferably in a range of 0.01% by mass to 10% by mass. Thereby, at the time of using the photocatalyst containing layer for an organic EL element, the light emission characteristic of the organic EL layer can be improved. The above-mentioned amount can be calculated by the measurement with an X-ray photoelectron spectrometer (XPS).

Moreover, in the present invention, the light emission characteristic material is contained in a range of 0.0001 to 0.5, more preferably in a range of 0.001 to 0.2 and particularly preferably in a range of 0.01 to 0.1 based on the mass of the photocatalyst contained in the photocatalyst containing coating solution for an organic EL element as 1. Thereby, the photocatalyst activation of the photocatalyst containing layer formed by using the photocatalyst containing coating solution for an organic EL element can be made high. The above-mentioned ratio can also be calculated by the measurement with the X-ray photoelectron spectrometer (XPS).

2. Photocatalyst

Next, the photocatalyst used in the present invention will be explained. The photocatalyst used in the present invention is not particularly limited as long as it is excited by the energy irradiation at the time of forming a photocatalyst containing layer using the photocatalyst containing coating solution for an organic EL element so as to decompose, modify, or the like the characteristic providing agent to be described later. Although the photocatalyst function mechanism represented by a titanium dioxide to be described later is not always clear, it is considered that the chemical structure of an organic substance is influenced by the direct reaction of a carrier produced by the energy irradiation with a compound in the vicinity or by the active oxygen species produced in the presence of oxygen and water. In the present invention, the carrier is considered to influence the characteristic providing agent to be described later.

As the photocatalyst used in the present invention, for example, metal oxides known as a semiconductor such as a titanium dioxide ($TiO_2$), azincoxide (ZnO), atinoxide ($SnO_2$), a strontium titanate ($SrTiO_3$), atungsten oxide ($WO_3$), abismuth oxide ($Bi_2O_3$), an iron oxide ($Fe_2O_3$) can be presented. Further, ametal complex, a silver or the like can also be used apart from the semiconductor. One or more of these examples can be mixed for use.

In the present invention, among these examples, it is particularly preferable to use a titanium dioxide. The titanium dioxide is advantageous in that it has a high band gap energy; it is chemically stable; it is not hazardous; and it is easily accessible. As the titanium dioxide, there are of the anatase type and the rutile type exist and either can be used in the present invention. In particular, it is preferable to use an anatase type titanium dioxide. The anatase type titanium dioxide has the exciting wavelength at 380 nm or less.

As the anatase type titanium dioxide, specifically, such as a hydrochloric acid peptisation type anatase type titania sol (STS-02, an average particle size 7 nm, produced by ISHIHARA SANGYO KAISHA, LTD.; ST-K01 produced by ISHIHARA SANGYO KAISHA, LTD.), a nitric acid peptisation type anatase type titania sol (produced by NISSAN CHEMICAL INDUSTRIES, LTD., TA-15, average particle size 12 nm) can be presented. Since the photocatalyst reaction can be carried out more effectively with a smaller particle size of the photocatalyst, and thus it is preferable. The average particle size is preferably 50 nm or less, and it is particularly preferable to use a photocatalyst of 20 nm or less.

Moreover, as the above-mentioned titanium oxide, those of a visible light response type may be used. A visible light response type titanium oxide is excited also by a visible light beam energy. As a visible light response method, a method of such as applying a nitriding treatment to a titanium oxide can be presented.

By the nitriding treatment of a titanium oxide ($TiO_2$), a new energy level is formed inside the band gap of the titanium oxide ($TiO_2$) so as to narrow the band gap. As a result, although the exciting wavelength of the titanium oxide ($TiO_2$) in general is 380 nm, it can be excited by a visible light beam longer than the exciting wavelength. Thereby, a wavelength in the visible light range of the energy irradiation by various light sources can contribute to the excitation of the titanium oxide ($TiO_2$) so that the titanium oxide can be sensitized further highly.

Here, the nitriding treatment of a titanium oxide in the present invention denotes a process such as a process of substituting a part of an oxygen site of a titanium oxide ($TiO_2$) with a nitrogen atom, a process of doping a nitrogen atom between the crystal lattices of the titanium oxide ($TiO_2$) or a process of disposing a nitrogen atom in the grain boundary of a polycrystalline aggregate of the titanium oxide ($TiO_2$) crystals.

The method for nitriding the titanium oxide ($TiO_2$) is not particularly limited. For example, a method of doping a nitrogen by the heat treatment of fine particles of a crystalline titanium oxide at 700° C. in the ammonium atmosphere, and providing a dispersion by using the fine particles with the nitrogen doped, an inorganic binder, a solvent, or the like can be presented.

The photocatalyst as mentioned above is contained in the solid component in photocatalyst containing coating solution for an organic EL element of the present invention in a range of 0.1 to 0.95, and more preferably in a range of 0.3 to 0.8 based on the total mass of the solid component as 1. Thereby, in the case the energy is directed to the photocatalyst containing layer formed by using the photocatalyst containing coating solution for an organic EL element, the characteristic providing agent to be described later can be decomposed, modified, or the like so that the surface characteristic of the photocatalyst containing layer can be changed. The above-mentioned amount can also be calculated by the measurement with the X-ray photoelectron spectrometer (XPS).

3. Characteristic Providing Agent

Next, the characteristic providing agent used for the photocatalyst containing coating solution for an organic EL element of the present invention will be explained. The kind or the like, of the characteristic providing agent used for the photocatalyst containing coating solution for an organic EL element is not particularly limited as long as it can change the surface characteristic of the photocatalyst containing layer by the action of the photocatalyst accompanied by the energy irradiation at the time of forming a photocatalyst containing layer by using the photocatalyst containing coating solution for an organic EL element. For example, it may be a material having a liquid repellent functional group so as to change the surface wettability by the decomposition, the substitution, or the like of the surface functional group by the action of the photocatalyst accompanied by the energy irradiation; or it may be one to be decomposed, modified, or the like by the action of the photocatalyst accompanied by the energy irradiation so as to change the bonding property with respect to a material providing the organic EL layer, the electrode layer, or the like.

It is preferable that the characteristic providing agent is contained in general by 0.001% by mass to 60% by mass, more preferably by 0.01% by mass to 50% by mass in the solid component of the photocatalyst containing coating solution for an organic EL element. Thereby, the characteristic of the photocatalyst containing layer formed by using the photocatalyst containing coating solution for an organic EL element can be changed.

Moreover, in the present invention, it is preferable that the characteristic providing agent provides the function as a binder in the photocatalyst containing coating solution for an organic EL element. Thereby, a binder needs not be contained additionally in the photocatalyst containing coating solution for an organic EL element.

Moreover, as the characteristic providing agent used for the present invention, a liquid repellency providing agent having the liquid repellency, to be decomposed or modified by the action of the photocatalyst accompanied by the energy irradiation is preferable. Since such a liquid repellency providing agent is used, the region without the energy irradiation in the photocatalyst containing layer formed by coating the photocatalyst containing coating solution for an organic EL element can be provided as a liquid repellent region, and the region with the energy irradiation can be provided as a lyophilic region. Thereby, utilizing the wettability difference between the region with the energy irradiation and the region without the energy irradiation, the organic element layer, each electrode layer, or the like of the organic EL element can be formed easily.

Here, "the photocatalyst containing layer has the liquid repellency" mentioned above denotes that the wettability with respect to a functional part forming coating solution for forming a functional part is low. Specifically, it is preferable that the above-mentioned photocatalyst containing layer in the energy unirradiated region has a contact angle with a liquid having a surface tension of 72 mN/m of 70° or more; more preferably a contact angle with a liquid having a surface tension of 72 mN/m of 80° or more; and particularly preferably a contact angle with a liquid having a surface tension of 72 mN/m of 90° or more. In the case the contact angle with a liquid in the energy unirradiated region is small, due to the insufficient liquid repellency, the functional part forming coating solution may remain.

On the other hand, "the photocatalyst containing layer has the lyophilic property" mentioned above denotes that the wettability of the photocatalyst containing layer and the functional part forming coating solution is preferable. Specifically, it is preferable that the photocatalyst containing layer in the energy irradiated region has a contact angle with a liquid having a surface tension of 72 mN/m of 20° or less; more preferably a contact angle with a liquid having a surface tension of 72 mN/m of 15° or less; and particularly preferably a contact angle with a liquid having a surface tension of 72 mN/m of 10° or less. In the case the contact angle with a liquid is high in the energy irradiated portion, spreading of the functional part forming coating solution in this portion may be deteriorated so as to generate a problem such as the function part lacking.

The contact angle with respect to a liquid here is obtained from the results or a graph of the results of measuring (30 seconds after of dropping liquid droplets from a micro syringe) the contact angle with respect to liquids having various surface tensions using a contact angle measuring device (CA-Z type manufactured by Kyowa Interface Science, Co., Ltd).

The above-mentioned liquid repellency providing agent is not particularly limited as long as it can lower the contact angle with a liquid of the photocatalyst containing layer by being decomposed, modified, or the like by the action of the photocatalyst accompanied by the energy irradiation. For example, it may be one having a function as a binder, or one without a function as a binder.

As the liquid repellency providing agent used in the present invention without a function as a binder, for example, a surfactant having a liquid repellent functional group so as to be aligned to the surface for realizing the liquid repellency at the time of coating the photocatalyst containing coating solution for an organic EL element can be presented. As such a surfactant, for example, those mentioned in JP-A No. 2003-195029 can be used.

Moreover, the liquid repellency providing agent also used as a binder is not particularly limited as long as it has a principal chain to be hardly deteriorated or decomposed by the action of the photocatalyst, and it has an organic group to be decomposed or modified by the action of the photocatalyst accompanied by the energy irradiation. It is particularly preferable to use an organopolysiloxane. Since the organopolysiloxane is contained in the photocatalyst containing coating solution for an organic EL element, a photocatalyst containing layer with an easily changeable wettability can be formed.

Furthermore, in particular, in the case an organopolysiloxane having a fluoro alkyl group is used, since the photocatalyst containing layer before the energy irradiation can have a particularly high liquid repellency, it is preferable to use the organopolysiloxane having a fluoro alkyl group in the case a high liquid repellency is required, or the like. As the organopolysiloxane, specifically, a hydrolysis condensed product, a co-hydrolyzed condensed product of one kind or more kinds of the fluoro alkyl silane can be presented. Those commonly known as a fluorine based silane coupling agent, disclosed for example, in JP-A No. 2003-195029 can be used.

Moreover, together with the above-mentioned organopolysiloxane, a stable organosilicone compound without a cross linking reaction such as a dimethyl polysiloxane may be mixed.

4. Photocatalyst Containing Coating Solution for an Organic EL Element

Next, the photocatalyst containing coating solution for an organic EL element of the present invention will be explained. The photocatalyst containing coating solution for an organic EL element in the present invention is not particularly limited as long as it contains the above-mentioned light emission characteristic improving agent, the photocatalyst and the characteristic providing agent, and as needed it may contain for example a solvent or various kinds of additives.

B. Organic EL Element

Next, an organic EL element of the present invention will be explained. The organic EL element of the present invention comprises: a substrate; a first electrode layer formed on the substrate; an organic electroluminescent layer formed on the first electrode layer; and a second electrode layer formed on the organic electroluminescent layer, wherein a photocatalyst containing layer containing a photocatalyst, a characteristic providing agent, and a light emission characteristic improving material having the function of improving the activation of the photocatalyst and the light emission characteristic of the organic electroluminescent layer so as to have the characteristic of the characteristic providing agent changed by the action of the photocatalyst accompanied by the energy irradiation is formed at any position between the substrate and the second electrode layer; and the light emission characteristic improving material is a silver salt of a fluorine or an acid selected from the group consisting of carboxylic acids, sulfonic acids, sulfinic acids, phenols, enols, thiophenols, imides, oximes, primary or secondary nitro compounds, clathrate compounds, a chloric acid and a perchloric acid.

The organic EL element of the present invention comprises, for example as shown in FIG. 1, a substrate 1, a first electrode layer 2 formed on the substrate 1, an organic EL layer 3 formed on the first electrode layer 2, and a second electrode layer 4 formed on the organic EL layer 3, wherein a photocatalyst containing layer 5 is formed at any position between the substrate 1 and second electrode layer 4 (in FIG. 1, between the first electrode layer 2 and the organic EL layer 3). In this case, the organic EL layer may be formed in a highly precise pattern by utilizing the pattern with the characteristic changed of the photocatalyst containing layer. For example as shown in FIG. 1, the organic EL element of the present invention may have such as an insulation layer 10 formed between the first electrode layers 2.

Moreover, for example as shown in FIG. 2, the organic EL element of the present invention may have a configuration comprising a substrate 1, a first electrode layer 2 formed on the substrate 1, an organic EL layer 3 formed on the first electrode layer 2, and a second electrode layer 4 formed on the organic EL layer 3, wherein a photocatalyst containing layer 5 is formed between the organic EL layer 3 and the second electrode layer 4. In this case, the second electrode layer 4 may be formed in a highly precise pattern by utilizing the pattern with the characteristic changed of the photocatalyst containing layer 5, or the like.

In the present invention, since the photocatalyst containing layer to have the characteristic change by the action of the photocatalyst accompanied by the energy irradiation is formed in the organic EL element, the organic EL layer, second electrode layer, or the like can be formed by utilizing the surface characteristic difference of the photocatalyst containing layer. Moreover, in the present invention, since the light emission characteristic improving material is contained in the photocatalyst containing layer, a high quality organic EL element with a preferable light emission characteristic of the organic EL layer can be provided.

Furthermore, in the present invention, since the light emission characteristic improving material is contained in the photocatalyst containing layer, the sensitivity of the photocatalyst can be made high so that the characteristic of the photocatalyst containing layer can be changed efficiently in a short time. Therefore, at the time of forming a characteristic changed pattern on the photocatalyst containing layer, the photocatalyst containing layer can have a characteristic changed pattern formed as a highly precise pattern with little energy spreading around, or the like. Therefore, according to the present invention by utilizing the characteristic changed pattern formed highly precisely on the photocatalyst containing layer, the organic EL layer, the second electrode layer, or the like can be formed in a highly precise pattern, and thus it is advantageous.

Hereinafter, each configuration of the organic EL element of the present invention will be explained in detail.

1. Photocatalyst Containing Layer

First, the photocatalyst containing layer used in the present invention will be explained. The photocatalyst containing layer used in the present invention is formed at any position between the substrate to be described later and the above-mentioned second electrode layer, and contains the photocatalyst, the characteristic providing agent, and the light emission characteristic improving material having the function of improving the activation of the photocatalyst and the light emission characteristic of the organic electroluminescent layer, so as to have the characteristic of the characteristic providing agent changed by the action of the photocatalyst accompanied by the energy irradiation. Further, as the light emission characteristic improving material, a silver salt of a fluorine or an acid selected from the group consisting of carboxylic acids, sulfonic acids, sulfinic acids, phenols, enols, thiophenols, imides, oximes, primary or secondary nitro compounds, clathrate compounds, a chloric acid and a perchloric acid are used.

In the present invention, the position for forming the photocatalyst containing layer is not particularly limited as long as it is between the substrate and the second electrode layer so that it can be selected optionally according to the kind of the layer to be patterned by using the photocatalyst containing layer. For example, in the case the above-mentioned organic EL layer is formed in a pattern utilizing the characteristic changed pattern of the photocatalyst containing layer, the photocatalyst containing layer is formed between the first electrode layer and the organic EL layer. Moreover, for example, in the case the above-mentioned second electrode layer is formed in a pattern utilizing the characteristic changed pattern of the photocatalyst containing layer, the photocatalyst containing layer is formed between the organic EL layer and the second electrode layer. Furthermore, in the case the organic EL layer and the second electrode layer are formed each utilizing the characteristic changed pattern, the photocatalyst containing layer is formed each between the first electrode layer and the organic EL layer, and between the organic EL layer and the second electrode layer.

Moreover, the photocatalyst containing layer has the characteristic changed by the action of the photocatalyst accompanied by the energy irradiation. The kind of the characteristic changed is not particularly limited. For example, it may be the surface wettability changed by the action of the photocatalyst accompanied by the energy irradiation, or it may be the bonding property changed with respect to a material for forming such as the organic EL layer or the second electrode layer by the action of the photocatalyst accompanied by the energy irradiation. In the present invention, particularly preferable is a layer to have the contact angle with a liquid of the surface lowered by the action of the photocatalyst accompanied by the energy irradiation. Thereby, the organic EL layer, the second electrode layer, or the like can be formed in a highly precise pattern by utilizing the wettability difference of the photocatalyst containing layer surface. The kind of the characteristic changed is determined according to the kind of the characteristic providing agent contained in the photocatalyst containing layer. Since the light emission characteristic material, the photocatalyst, and the characteristic providing agent contained in the photocatalyst containing layer are same as those explained in the above-mentioned "A. Photocatalyst containing coating solution for an organic EL element", detailed explanation is omitted here.

Moreover, formation of the photocatalyst containing layer can be carried out by a known coating method such as spin coating, spray coating, dip coating, roll coating and bead coating, using the above-mentioned "A. Photocatalyst containing coating solution for an organic EL element".

Moreover, the film thickness of the photocatalyst containing layer is selected optionally according to the kind, or the like of the organic EL element. It is in general about 0.5 nm to 500 nm, more preferably about 30 nm to 300 nm, and particularly preferably about 40 nm to 200 nm. Thereby, the photocatalyst containing layer can realize the above-mentioned characteristics.

Moreover, as a method for forming a characteristic changed pattern with the characteristic changed in the photocatalyst containing layer, for example, a method of directing the energy 7 to the photocatalyst containing layer 5 using such as a photo mask 6 as shown in FIG. 3A for decomposing or modifying the characteristic providing agent in the region with the energy irradiated to form a characteristic changed pattern 8 as shown in FIG. 3B can be provided.

Here, the energy irradiation (exposure) in the present invention is a concept including any energy line irradiation capable of changing the surface characteristic of the photocatalyst containing layer, and thus it is not limited to the visible light irradiation.

In general, the wavelength of a light used for such energy irradiation can be set in a range of 400 nm or less and preferably in a range of 150 nm to 380 nm. This is because, as mentioned above, the preferable photocatalyst used for the photocatalyst containing a layer is a titanium dioxide, and a light of the above-mentioned wavelength is preferable as the energy for activating the photocatalyst function by the titanium dioxide.

As a light source to be used for the energy irradiation, a mercury lamp, a metal halide lamp, a xenon lamp, an excimer lamp, and other various light sources can be presented. Moreover, in addition to a method for carrying out the pattern irradiation via a photo mask using the above-mentioned light sources, a method of a pattern drawing irradiation using a laser beam such as the excimer and the YAG can also be used.

The energy irradiation amount at the time of the energy irradiation is the irradiation amount necessary for changing the surface characteristic of the photocatalyst containing layer by the action of the photocatalyst in the photocatalyst containing layer. Moreover, in the case of carrying out the energy irradiation via the above-mentioned photo mask, it is preferable to control the temperature such that the temperature difference between the photo mask disposed between the photocatalyst containing layer and the energy irradiation source, and the above-mentioned photocatalyst containing layer is to be ±3° C. Thereby, exposure with further little positional displacement can be enabled so that spreading of the coating solution can be controlled at the time of forming the members such as the light emitting layer and the electrode layer, and thus it is preferable. Specifically, it is preferable to control the same in a range of 15° C. to 80° C.

In the case the substrate to be described later, or the like is transparent, the energy irradiation direction in the present invention may be from either the substrate side or the photocatalyst containing layer side. On the other hand, in the case the substrate, or any layer formed between the substrate and the photocatalyst containing layer is not transparent, the energy irradiation should be carried out from the photocatalyst containing layer side.

2. Organic EL Layer

The organic EL layer used in the present invention comprises one layer or a plurality of organic layers including at least the light emitting layer. That is, the organic EL layer is a layer including at least the light emitting layer with the layer configuration of one or more organic layers. In general, in the case of forming the organic El layer with the wet process by coating, since a large number of layers can hardly be laminated in terms of the solvent, it is formed with one or two organic layers in most cases. A larger number of layers, however, can be provided by skillfully preparing the organic material or using the vacuum deposition method in combination.

As the organic layer formed in the organic EL layer other than the light emitting layer, a charge injecting layer such as a hole injecting layer and an electron injecting layer can be presented. Furthermore, as the other organic layers, a charge transporting layer such as a hole transporting layer for transporting the hole to the light emitting layer and an electron transporting layer for transporting the electron to the light emitting layer can be presented. In general, these are integrated with the charge injecting layer by providing the charge transporting function to the above-mentioned charge injecting layer in most cases. Additionally, as an organic layer formed in the organic EL layer, a layer for preventing piercing of the hole or the electron such as a carrier block layer for improving the re-bonding efficiency, or the like can be presented.

In the present invention, since the above-mentioned photocatalyst containing layer has the function of transporting the hole and the function of injecting the hole, it may also play the role of the hole injecting layer, the hole transporting layer, or the hole injecting and transporting layer comprising a single layer having both the hole injecting function and the hole transporting function.

Hereinafter, each configuration of such an organic EL layer will be explained.

a. Light Emitting Layer

As the light emitting material used for the light emitting layer which is the essential configuration of the organic EL layer in the present invention, for example, a pigment based light emitting material, a metal complex based light emitting material, and a polymer based light emitting material can be used.

As the pigment based light emitting material, for example, a cyclopentadiene derivative, a tetraphenyl butadiene derivative, a triphenyl amine derivative, an oxadiazol derivative, a pyrazoloquinoline derivative, a distylyl benzene derivative, a distylyl arylene derivative, a silol derivative, a thiophene ring compound, a pyridine ring compound, a perynon derivative, a perylene derivative, an oligothiophene derivative, a triphmanyl amine derivative, an oxadiazol dimer, or a pyrazoline dimer can be presented.

Moreover, as the metal complex based light emitting material, for example, metal complexes having Al, Zn, Be or Ir, or a rare earth metal such as Tb, Eu, Dy as the central metal, and an oxadiazol, a thiadiazol, a phenyl pyridine, a phenyl benzoimidazol, a quinoline structure, or the like as the ligand, such as an aluminum quinolinol complex, a benzoquinolinol beryllium complex, a benzoxazol zinc complex, a benzothiazol zinc complex, an azomethyl zinc complex, a porphiline zinc complex, or an europium complex can be presented.

Furthermore, as the polymer based light emitting material, for example, a polyparaphenylene vinylene derivative, a polythiophene derivative, a polyparaphenylene derivative, a polysilane derivative, a polyacetylene derivative, a polyvinyl carbazol, a polyfluolene derivative, a polyquinoxaline derivative, or a polymer thereof can be presented.

For the purpose of improving the light emitting efficiency, changing the light emitting wavelength, or the like, a doping agent may be added into the light emitting layer. As such a doping agent, for example, a perylene derivative, a coumarin derivative, a rubrene derivative, a quinacridone derivative, a squalium derivative, a porphiline derivative, a styryl based pigment, a tetracene derivative, a pyrazoline derivative, a decacyclene, a phenoxazone, a quinoxaline derivative, a carbazol derivative, and a fluolene derivative can be presented.

The thickness of the light emitting layer is not particularly limited as long as it is a thickness capable of providing the field for re-bonding of the electron and the hole so as to provide the light emitting function. For example, it can be about 1 nm to 500 nm.

In the present invention, as mentioned above, in the case the photocatalyst containing layer also plays the role of such as the hole injecting layer, the hole transporting layer, or the hole injecting and transporting layer comprising a single layer having both the hole injecting function and the hole transporting function, it is preferable that the light emitting layer is formed in a pattern as the organic EL layer provided adjacently to the above-mentioned photocatalyst containing layer. Since the light emitting layer is formed in a pattern so as to provide the light emitting layer of three colors of red, green and blue, a color display can be enabled. Moreover, since the photocatalyst containing layer containing the light emission characteristic material mentioned above and the light emitting layer are provided adjacently, an organic EL element having high light emission characteristic can be provided.

As to the method for forming such a light emitting layer, it can be formed, for example, by coating a light emitting layer forming coating solution containing the above-mentioned material on the photocatalyst containing layer with the above-mentioned characteristic changed pattern formed. Although the method for coating such a light emitting layer forming coating solution is not particularly limited as long as it is a method capable of coating on the characteristic changed pattern of the photocatalyst containing layer, a method capable of forming the light emitting layer evenly and highly precisely is preferable. As such a coating method, for example, a dip coating method, a roll coating method, a blade coating method, a spin coating method, a micro gravure coating method, a gravure coating method, bar coating method, a wire bar coating method, a casting method, an ink jet method, an LB method, a flexo printing method, an offset printing method, or a screen printing method can be presented.

b. Charge Injecting and Transporting Layer

In the present invention, the charge injecting and transporting layer may be formed between the first electrode layer or the second electrode layer and the light emitting layer. The charge injecting and transporting layer here has the function of stably transporting the charge from the first electrode layer or the second electrode layer to the light emitting layer. Since such a charge injecting and transporting layer is provided between the light emitting layer and the first electrode layer or the second electrode layer, charge injection to the light emitting layer can be stabilized so as to improve the light emitting efficiency.

As such a charge injecting and transporting layer, there are a hole injecting and transporting layer for transporting the hole injected from the anode into the light emitting layer, and an electron injecting and transporting layer for transporting the electron injected from the cathode into the light emitting layer. Hereinafter, the hole injecting and transporting layer and the electron injecting and transporting layer will be explained.

(i) Hole Injecting and Transporting Layer

The hole injection and transporting layer used in the present invention may be one of the hole injecting layer for injecting the hole into the light emitting layer or the hole transporting layer for transporting the hole, a lamination of the hole injecting layer and the hole transporting layer, or a single layer having the both functions of the hole injecting function and the hole transporting function.

In the present invention, since the first electrode in general is an anode, the hole injecting and transporting layer is formed between the light emitting layer and the first electrode layer.

The material used for the hole injecting and transporting layer is not particularly limited as long as it is a material capable of stably transporting the hole injected from the anode into the light emitting layer. In addition to the compounds presented for the light emitting material for the above-mentioned light emitting layer, oxides such as a phenyl amine based one, a star burst type amine based one, a phthalocyanine based one, a vanadium oxide, a molybdenum oxide, a ruthenium oxide, an aluminum oxide and a titanium oxide, an amorphous carbon, a polyaniline, a polythiophene, a polyphenylene vinylene derivative, or the like can be used. As a specific example, a bis(N-(1-naphthyl-N-phenyl) benzidine ($\alpha$-NPD), a 4,4,4-tris(3-methyl phenyl phenyl amino) triphenyl amine (MTDATA), a poly (3,4-ethylene dioxythiophene)-polystyrene sulfonic acid (PEDOT-PSS), a polyvinyl carbazole (PVCz) can be presented.

Moreover, the thickness of the hole injecting and transporting layer is not particularly limited as long as it is a thickness capable of sufficiently performing the function of injecting the hole from the anode and transporting the hole to the light emitting layer. Specifically, it is in a range of 0.5 nm to 1,000 nm, in particular it is preferably in a range of 10 nm to 500 nm.

(ii) Electron Injecting and Transporting Layer

The electron injecting and transporting layer used in the present invention may be one of the electron injecting layer for injecting the electron into the light emitting layer or the electron transporting layer for transporting the electron, a lamination of the electron injecting layer and the electron transporting layer, or a single layer having the both functions of the electron injecting function and the electron transporting function.

In the present invention, since the second electrode layer in general is a cathode, the electron injecting and transporting layer is formed between the light emitting layer and the second electrode layer.

The material used for the electron injecting layer is not particularly limited as long as it is a material capable of stabilizing the electron injecting into the light emitting layer. In addition to the compounds presented for the light emitting material for the above-mentioned light emitting layer, alkaline metals, halides of alkaline metals and organic complexes of alkaline metals such as an aluminum-lithium alloy, a lithium fluoride, a strontium, a magnesium oxide, a magnesium fluoride, a strontium fluoride, a calcium fluoride, a barium fluoride, an aluminum oxide, a strontium oxide, a calcium, a polymethyl methacrylate, a sodium polystyrene sulfonate, a lithium, a cesium and a cesium fluoride can be used.

The thickness of the electron injecting layer is not particularly limited as long as it is a thickness capable of sufficiently performing the electron injecting function.

Moreover, the material used for the electron transporting layer is not particularly limited as long as it is a material capable of transporting the electron injected form the first electrode layer or the second electrode layer into the light emitting layer. For example, a vasocuproine, a vasophenanthroline, a phenanthroline derivative, a triazol derivative, an oxadiazol derivative, or a tris(8-quinolinolato) aluminum complex ($Alq_3$) can be presented.

The thickness of the electron transporting layer is not particularly limited as long as it is a thickness capable of sufficiently performing the electron transporting function.

Furthermore, as the electron injecting and transporting layer comprising a single layer having the both functions of the electron injecting function and the electron transporting function, a metal doped layer produced by doping an alkaline metal or an alkaline earth metal to an electron transporting organic material can be used. As the electron transporting organic material, for example, a bathcuproine, a bathphenanthroline, or a phenanthroline derivative can be presented. As the doping metal, Li, Cs, Ba, Sr or the like can be presented.

The thickness of the electron injecting and transporting layer comprising a single layer is not particularly limited as long as it is a thickness capable of sufficiently performing the electron injecting function and the electron transporting function.

3. First Electrode Layer

Next, the first electrode layer used in the present invention will be explained. The first electrode layer used in the present invention is formed on the substrate to be described later, and it may be formed on the substrate either on the entire surface or in a pattern. Moreover, the electrode layer used in the present invention may either be an anode or a cathode. It is formed in general as an anode.

Moreover, the electrode layer may either be transparent or not, and it can be selected optionally according to the light taking out surface, receiving surface, or the like. In the case of taking out a light for example from the electrode layer side in the organic EL element of the present invention, the electrode layer should be transparent or translucent.

As the anode, it is preferable to use a conductive material having a large work function so as to facilitate the hole injection. Specifically, a metal having a large work function such as an ITO, an indium oxide, and a gold, a conductive polymer such as apolyaniline, apolyacetylene, apolyalkyl thiophene derivative and a polysilane derivative can be presented.

Moreover, it is preferable that the electrode layer has a small resistance. In general a metal material is used, however, an organic compound or an inorganic compound may be used as well.

As the method for forming the electrode layer, a common electrode forming method can be used. For example, the PVD method and the CVD method such as the vacuum deposition method, the sputtering method, and the ion plating method can be presented. Moreover, the method for patterning the electrode layer is not particularly limited as long as it is a method capable of forming into a desired pattern precisely. Specifically, such as a photolithography method can be presented.

4. Second Electrode Layer

Next, the second electrode layer used in the present invention will be explained. The second electrode layer, used in the present invention is formed on the above-mentioned organic EL layer, is an electrode facing the above-mentioned first electrode layer. The second electrode layer used in the present invention may either be an anode or a cathode. It is formed in general as a cathode.

Moreover, the second electrode layer may either be transparent or not, and it can be selected optionally according to the light taking out surface, receiving surface, or the like. In the case of taking out a light for example from the second electrode layer side, the second electrode layer should be transparent or translucent.

As the cathode, it is preferable to use a conductive material having a small work function so as to facilitate the electron injection. For example, a magnesium alloy such as MgAg, an aluminum alloy such as AlLi, AlCa and AlMg, alkaline metals and alkaline earth metals such as Li and Ca, or an alloy of the alkaline metals and the alkaline earth metals can be presented.

Moreover, it is preferable that the second electrode layer has a small resistance. In general, a metal material is used, however, an organic compound or an inorganic compound may be used as well.

Moreover, the method for forming the second electrode layer may be the same method as for the above-mentioned first electrode layer. For example, in the case the photocatalyst containing layer is formed on the above-mentioned organic EL layer, the second electrode layer may be formed by utilizing the pattern with the surface characteristic changed of the photocatalyst containing layer. In this case, for example a method for forming the second electrode layer by coating a colloid solution containing such as the above-mentioned material on the photocatalyst containing layer for adhering the same only on the targeted pattern may be used. As such a coating method, for example, a dip coating method, a roll coating method, a blade coating method, a spin coating method, a micro gravure coating method, a gravure coating method, bar coating method, a wire bar coating method, a casting method, an ink jet method, a LB method, a flexo printing method, an offset printing method, or a screen printing method can be presented. Moreover, a method of forming the second electrode layer by adhering the coating solution containing the above-mentioned material by for example the electrolysis jetting method on the photocatalyst containing layer for adhering the same only on the targeted pattern may be used. Since the other points of the second electrode layer are same as those explained in the above-mentioned item of the first electrode layer, explanation is omitted here.

5. Substrate

Next, the substrate used in the present invention will be explained. The substrate used in the present invention is not particularly limited as long as it supports the first electrode layer, or the like, and it has a predetermined strength. In the present invention, in the case the above-mentioned first electrode layer has a predetermined strength, the electrode layer may also serve as the substrate, however, the first electrode layer is generally formed on a substrate having a predetermined strength.

The substrate is not particularly limited as long as the first electrode layer, or the like can be formed thereon. Whether or not the light transmitting property is needed can be determined optionally for example according to the light taking out surface or receiving surface. Since it is generally preferable to have the substrate side as the light taking out surface or receiving surface, the substrate can be formed preferably with a transparent material.

As the material for forming the substrate, for example, a glass substrate such as a soda lime glass, an alkaline glass, a lead alkaline glass, a borosilicate glass, an alumino silicate glass, and a silica glass, or a resin substrate to be shaped like a film can be used. The resin used for the resin substrate is preferably a polymer material having relatively high solvent resistance and heat resistance. Specifically, a fluorine based resin, a polyethylene, a polypropylene, a polyvinyl chloride, a polyvinyl fluoride, a polystyrene, an ABS resin, a polyamide, a polyacetal, a polyester, a polycarbonate, a modified polyphenylene ether, a polysulfone, a polyallylate, a polyether imide, a polyether sulfone, a polyamide imide, a polyimide, a polyphenylene sulfide, a crystalline polyester, a polyethylene terephathalate, a polybutylene terephthalate, a polyethylene naphthalate, a polymicroixylene dimethylene terephthalate, a polyoxymethylene, a polyether sulfone, a polyether ether ketone, a polyacrylate, an acrylonitrile-styrene resin, a phenol resin, a urea resin, a melamine resin, an unsaturated polyester resin, an epoxy resin, a polyurethane, a silicone resin, a noncrystalline polyolefine, or the like can be presented. Moreover, in addition to the above mentioned, a polymer capable of satisfying the predetermined conditions may be used, and a copolymer of two or more kinds can be used as well. Furthermore, as needed, a substrate having the gas barrier property for blocking a gas such as a moisture content and oxygen can also be used.

Moreover, in the present invention, a light shielding part or an insulation layer may be formed on the substrate. As to the light shielding part, the insulation layer, or the like, they may be same as those used for a common organic EL element.

6. Organic EL Element

Next, the organic EL element of the present invention will be explained. The organic EL element of the present invention is not particularly limited as long as it comprises the above-mentioned substrate, first electrode layer, organic EL layer, second electrode layer and photocatalyst containing layer. As needed, it may optionally have an insulation layer, a barrier layer, or the like.

The present invention is not limited to the above-mentioned embodiments. The embodiments are merely examples, and any one having the substantially same configuration as the technological idea disclosed in the claims of the present invention and the same effects is included in the technological scope of the present invention.

EXAMPLES

Hereinafter, the present invention will be explained further specifically with reference to the examples and the comparative examples.

Example 1

Cleaning of the Substrate with the First Electrode Layer Formed

A substrate with a first electrode layer, having an ITO layer (first electrode layer) formed in a pattern on a 150 mm square glass substrate was washed by ultrasonic cleaning in a solvent containing an isopropyl alcohol and an acetone.
(Formation of the Photocatalyst Containing Layer)

Subsequently, by mixing and dispersing a photocatalyst containing solution (coating solution 1) having the following composition, and containing a photocatalyst and a liquid repellency providing agent, and a light emission characteristic material containing solution (coating solution 2) having the following composition, and containing a light emission characteristic material, a photocatalyst containing coating solution for an organic EL element (coating solution 3) was provided. The photocatalyst containing layer forming coating solution for an organic EL element was coated onto the above-mentioned substrate with a first electrode layer formed with a spin coater and a drying process was carried out in a clean oven (150° C.) for 10 minutes. Thereby, a 60 nm film thickness transparent photocatalyst containing layer was formed. The contact angle of the photocatalyst containing layer with the distilled water was measured using a contact angle measuring device (CA-Z type manufactured by Kyowa Interface Science, Co., Ltd) so as to be found out as 80° or more. Next, energy irradiation was carried out to the photocatalyst containing layer using a high pressure mercury lamp (254, 365 nm) via a photo mask having the same pattern as the pattern for forming the organic EL layer by a 70 mW/cm² illuminance. The accumulated exposure amount at the time and the relationship with the contact angle with a xylene of the region with the energy irradiated are shown in FIG. 4. Moreover, the exposure amount necessary for having the contact angle of the photocatalyst containing layer with the distilled water to be 10° (the value in the case the exposure amount necessary for having the contact angle of the photocatalyst containing layer with the distilled water to be 10° in the comparative example 1 to be described later is provided as 1) is shown in the table 1.

| <Composition of the photocatalyst containing solution (coating solution 1)> | |
|---|---|
| Titanium dioxide sol liquid (STS-01 produced by ISHIHARA SANGYO KAISHA, LTD.) | 3 parts by weight |
| Tetraethoxy silane | 1 part by weight |
| Isopropyl alcohol | 100 parts by weight |
| Fluoro alkoxy silane (MF-160E produced by Tohkem Co., Ltd.) | 7.5 parts by weight |

| <Composition of the light emission characteristic material containing solution (coating solution 2)> | |
|---|---|
| Silver acetate | 0.5 part by weight |
| Isopropyl alcohol | 99.5 parts by weight |

Comparative Example 1

A transparent photocatalyst containing layer having a 60 nm film thickness was formed in the same manner as in the example 1 except that the photocatalyst containing layer was formed by using only the above-mentioned photocatalyst containing solution (coating solution 1) on the substrate with a first electrode layer formed. The contact angle of the photocatalyst containing layer with the distilled water was measured using a contact angle measuring device (CA-Z type manufactured by Kyowa Interface Science, Co., Ltd) so as to be found out as 80° or more. Next, energy irradiation was carried out to the photocatalyst containing layer using a high pressure mercury lamp (254, 365 nm) via a photo mask having the same pattern as the pattern for forming the organic EL layer by a 70 mW/cm² illuminance. The accumulated exposure amount at the time and the relationship with the contact angle with a xylene of the region with the energy irradiated are shown in FIG. 4.

Example 2

A photocatalyst containing layer was formed in the same manner as in the example 1 except that the silver acetate in the light emission characteristic material containing solution was changed to a camphorsulfonic acid, and energy irradiation was carried out using a high pressure mercury lamp (254, 365 nm) by a 70 mW/cm² illuminance. The exposure amount necessary for having the contact angle of the photocatalyst containing layer with the distilled water to be 10° at the time is shown in the table 1 (the value in the case the exposure amount necessary for having the contact angle of the photocatalyst containing layer with the distilled water to be 10° in the above-mentioned comparative example 1 is provided as 1).

Example 3

A photocatalyst containing layer was formed in the same manner as in the example 1 except that the silver acetate in the light emission characteristic material containing solution was changed to a silver acetyl acetonate complex, and energy irradiation was carried out using a high pressure mercury lamp (254, 365 nm) by a 70 mW/cm² illuminance. The exposure amount necessary for having the contact angle of the photocatalyst containing layer with the distilled water to be 10° at the time is shown in the table 1 (the value in the case the exposure amount necessary for having the contact angle of the photocatalyst containing layer with the distilled water to be 10° in the above-mentioned comparative example 1 is provided as 1).

Example 4

A photocatalyst containing layer was formed in the same manner as in the example 1 except that the silver acetate in the light emission characteristic material containing solution was changed to a silver mercaptide, and energy irradiation was carried out using a high pressure mercury lamp (254, 365 nm)

by a 70 mW/cm² illuminance. The exposure amount necessary for having the contact angle of the photocatalyst containing layer with the distilled water to be 10° at the time is shown in the table 1 (the value in the case the exposure amount necessary for having the contact angle of the photocatalyst containing layer with the distilled water to be 10° in the above-mentioned comparative example 1 is provided as 1).

Example 5

A photocatalyst containing layer was formed in the same manner as in the example 1 except that the silver acetate in the light emission characteristic material containing solution was changed to a silver fluoride, and energy irradiation was carried out using a high pressure mercury lamp (254, 365 nm) by a 70 mW/cm² illuminance. The exposure amount necessary for having the contact angle of the photocatalyst containing layer with the distilled water to be 10° at the time is shown in the table 1 (the value in the case the exposure amount necessary for having the contact angle of the photocatalyst containing layer with the distilled water to be 10° in the above-mentioned comparative example 1 is provided as 1).

Example 6

A photocatalyst containing layer was formed in the same manner as in the example 1 except that the silver acetate in the light emission characteristic material containing solution was changed to a silver chlorate, and energy irradiation was carried out using a high pressure mercury lamp (254, 365 nm) by a 70 mW/cm² illuminance. The exposure amount necessary for having the contact angle of the photocatalyst containing layer with the distilled water to be 10° at the time is shown in the table 1 (the value in the case the exposure amount necessary for having the contact angle of the photocatalyst containing layer with the distilled water to be 10° in the above-mentioned comparative example 1 is provided as 1).

Example 7

A photocatalyst containing layer was formed in the same manner as in the example 1 except that the silver acetate in the light emission characteristic material containing solution was changed to a silver perchlorate, and energy irradiation was carried out using a high pressure mercury lamp (254, 365 nm) by a 70 mW/cm² illuminance. The exposure amount necessary for having the contact angle of the photocatalyst containing layer with the distilled water to be 10° at the time is shown in the table 1 (the value in the case the exposure amount necessary for having the contact angle of the photocatalyst containing layer with the distilled water to be 10° in the above-mentioned comparative example 1 is provided as 1).

TABLE 1

|  | Silver salt of the coating Solution 2 | Exposure amount to have the contact angle less than 10° |
| --- | --- | --- |
| Example 1 | Silver acetate | 0.5 |
| Example 2 | Camphor silver sulfonate | 0.6 |
| Example 3 | Silver acetyl acetonate complex | 0.55 |
| Example 4 | Silver mercaptide | 0.63 |
| Example 5 | Silver fluoride | 0.53 |
| Example 6 | Silver chlorate | 0.52 |

TABLE 1-continued

|  | Silver salt of the coating Solution 2 | Exposure amount to have the contact angle less than 10° |
| --- | --- | --- |
| Example 7 | Silver perchlorate | 0.67 |
| Comparative example 1 | No light emission characteristic improving material | 1 |

[Evaluation]

From FIG. 4, it was confirmed that the wettability of the formed photocatalyst containing layer can be changed efficiently with a small exposure amount by including the light emission characteristic improving material in the photocatalyst containing solution for forming an organic EL element. Moreover, from the table 1, it was confirmed that the wettability of the formed photocatalyst containing layer can be changed efficiently with a small exposure amount by including the light emission characteristic improving material in the photocatalyst containing solution for forming an organic EL element in any of the examples 1 to 7.

Example 8

Formation of the Photocatalyst Containing Layer

A 50 nm film thickness photocatalyst containing layer was formed using the above-mentioned coating solution 3 in the same manner as in the example 1 except that a substrate with a first electrode layer together with an ITO layer (first electrode layer) patterned in the center by a 2 mm width. The contact angle of the photocatalyst containing layer with the distilled water was measured by using a contact angle measuring device (CA-Z type manufactured by Kyowa Interface Science, Co., Ltd) so as to be found out as 80° or more. Next, energy irradiation was carried out for the photocatalyst containing layer using a high pressure mercury lamp (254, 365 nm) via a photo mask having the same pattern as the pattern for forming the organic EL layer so as to have the accumulated exposure amount to 5,000 mJ/cm².

(Formation of the Organic EL Layer)

Subsequently, a coating solution for forming an organic EL layer having the following composition was coated onto the above-mentioned photocatalyst containing layer for adhering the same to only the region with the photocatalyst containing layer became lyophilic. Thereafter, by drying at 80° C. for 30 minutes, a light emitting layer having a 1,000 Å film thickness (organic EL layer) was obtained.

| <Coating solution for forming an organic EL layer> | |
| --- | --- |
| ADS 132GE (product name) produced by American Dye Source, Inc. | 1 part by weight |
| Xylene | 66.67 parts by weight |

(Formation of the Second Electrode Layer)

Thereafter, a LiF film (film thickness 5 nm) and an Al film (film thickness 2,000 Å) were formed by the mask deposition method so as to have a 2 mm×2 mm light emitting part. At the time, the LiF film and the Al film were formed in a pattern so as to be orthogonal to the ITO film pattern. Accordingly, the organic EL element of the present invention was produced.

Comparative example 2

An organic EL element was produced in the same manner as in the example 2 except that the photocatalyst containing layer was formed using only the above-mentioned photocatalyst containing solution (coating solution 1).

Example 9

An organic EL element was formed in the same manner as in the example 8 except that the silver acetate in the light emission characteristic material containing solution was changed to a camphorsulfonic acid.

Example 10

An organic EL element was formed in the same manner as in the example 8 except that the silver acetate in the light emission characteristic material containing solution was changed to a silver acetyl acetonate complex.

Example 11

An organic EL element was formed in the same manner as in the example 8 except that the silver acetate in the light emission characteristic material containing solution was changed to a silver mercaptide.

Example 12

An organic EL element was formed in the same manner as in the example 8 except that the silver acetate in the light emission characteristic material containing solution was changed to a silver fluoride.

Example 13

An organic EL element was formed in the same manner as in the example 8 except that the silver acetate in the light emission characteristic material containing solution was changed to a silver chlorate.

Example 14

An organic EL element was formed in the same manner as in the example 8 except that the silver acetate in the light emission characteristic material containing solution was changed to a silver perchlorate.
[Evaluation]

Figure 5:
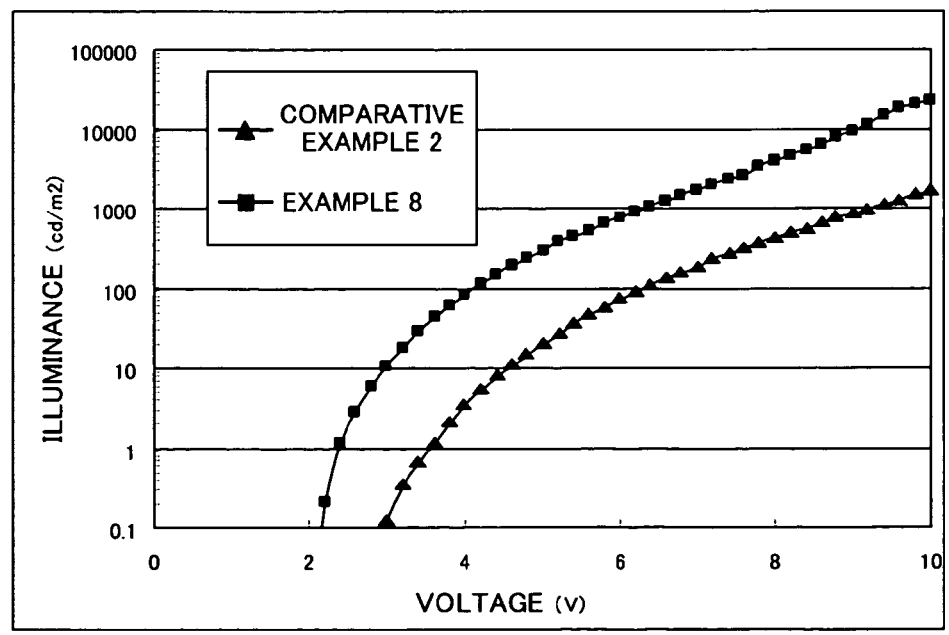
FIG. 5 is a graph showing the illuminance-voltage characteristic of an organic EL element in the example 8 and the comparative example 2 of the present invention.
Figure 6:
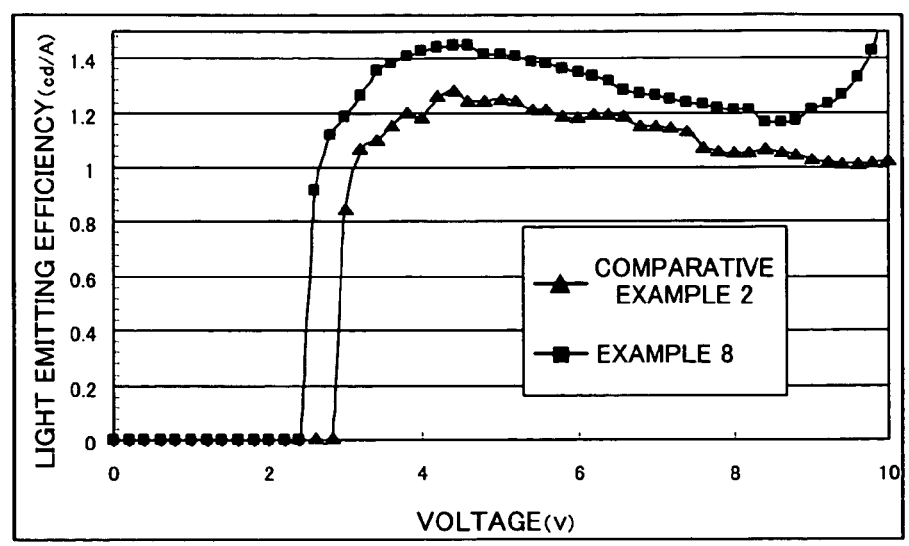
FIG. 6 is a graph showing the light emitting efficiency-voltage characteristic of an organic EL element in the example 8 and the comparative example 2 of the present invention.

The light emission of the organic EL elements of the example 8 and the comparative example 2 was observed respectively by driving the Al electrode (second electrode layer) formed in the upper part of the ITO electrode (first electrode layer) as an address electrode. The light emission characteristic of the organic EL elements were measured so as to show the illuminance-voltage characteristic as shown in FIG. 5 and the light emitting efficiency-voltage characteristic as shown in FIG. 6. Moreover, also as to the examples 9 to 14, the light emission characteristic of the respective organic EL elements was measured in the same manner. The respective illuminances of each organic El element at the time of applying a 5V voltage are shown in the table 2.

TABLE 2

|  | Silver salt of the coating solution 2 | Illuminance at the time of 5 V |
| --- | --- | --- |
| Example 8 | Silver acetate | 110 nit |
| Example 9 | Camphor silver sulfonate | 120 nit |
| Example 10 | Silver acetyl acetonate complex | 100 nit |
| Example 11 | Silver mercaptide | 95 nit |

TABLE 2-continued

|  | Silver salt of the coating solution 2 | Illuminance at the time of 5 V |
| --- | --- | --- |
| Example 12 | Silver fluoride | 110 nit |
| Example 13 | Silver chlorate | 130 nit |
| Example 14 | Silver perchlorate | 80 nit |
| Comparative example 2 | No light emission characteristic improving material | 20 nit |

From these results, it was confirmed that the light emission starting voltage can be lowered so as to improve the illuminance at the same voltage by including the light emission characteristic improving material in the above-mentioned photocatalyst containing layer.

Example 15

Formation of a Transparent Electrode

An ITO film was formed by a 1,500 Å film thickness as a first electrode layer on a cleaned glass substrate by the sputtering method. Thereafter, the ITO film was patterned by the photolithography method so as to have a 85 µm line width and a 100 µm pitch.
(Formation of an Insulation Layer)

After coating a negative type resist (V259PA produced by Nippon Steel Chemical Co., Ltd.) on the substrate with the first electrode layer formed so as to have a 1 µm dry film thickness by a spin coating method, it was baked at 120° C. for 1 hour. Thereafter, exposure was carried out with a 365 nm UV beam by a 500 mJ exposure amount via a photo mask so as to cover the edge part of the first electrode layer line with an insulation layer. At this time, a 20 µm gap between the photo mask and the substrate was provided. After developing the same with an organic alkaline developing agent (V2590D produced by Nippon Steel Chemical Co., Ltd.) for 40 seconds and by baking at 160° C. for 1 hour, an insulation layer was formed.
(Formation of the Photocatalyst Containing Layer)

Using 4 g of the coating solution 3 as in the same manner as the example 2, a 60 nm film thickness transparent photocatalyst containing layer was formed on the substrate with the above-mentioned first electrode layer and the insulation layer formed. The contact angle of the photocatalyst containing layer with the distilled water was measured by using a contact angle measuring device (CA-Z type manufactured by Kyowa Interface Science, Co., Ltd) so as to be found out as 80° or more. Next, energy irradiation was carried out to the photocatalyst containing layer using a high pressure mercury lamp (254, 365 nm) via a photo mask having the same pattern as the pattern for forming the organic EL layer by a 70 mW/cm² illuminance for 50 seconds so as to obtain a wettability changed pattern having the exposed region as a lyophilic region and the unexposed region as a liquid repellent region.
(Formation of the Organic EL Layer)

A red light emitting layer forming coating solution with 1 part by weight of a polyfluorene derivative (ADS100RE produced by American Dye Source, Inc.) showing the red light emission dissolved in 66.67 parts by weight of a toluene solution, a green light emitting layer forming coating solution with 1 part by weight of a polyfluorene derivative (ADS132GE produced by American Dye Source, Inc.) showing the green light emission dissolved in 66.67 parts by weight of a toluene solution, and a blue light emitting layer forming coating solution with 1 part by weight of a polyfluorene derivative (ADS135BE produced by American Dye Source, Inc.) showing the blue light emission dissolved in 66.67 parts by weight of a toluene solution, were prepared respectively. Using an ink jet coating device, the solutions were coated on the above-mentioned photocatalyst containing layer so as to be arranged alternately. Thereafter, by drying at 80° C. for 30 minutes, three color light emitting layers each of a 1,000 Å film thickness were formed in a pattern.

(Formation of the Second Electrode Layer)

Thereafter, with a light emitting part for 1 pixel provided by 240 μm×60 μm, a LiF film (film thickness 5 nm) and a Al film (film thickness 2,000 Å) were formed by the mask deposition method. At the time, the LiF film and the Al film were formed in a pattern so as to be orthogonal to the ITO film pattern.

Thereby, an organic EL element was produced.

Figure 7:
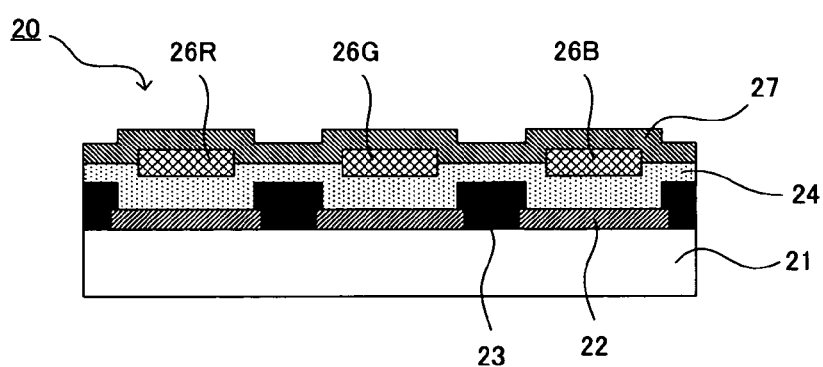
FIG. 7 is a schematic cross-sectional view for explaining the configuration of the organic EL element formed by the example 15 of the present invention.

FIG. 7 is a schematic cross-sectional view showing an organic EL element produced accordingly. According to the organic EL element 20, the first electrode layer (ITO electrode) 22 is formed in a pattern on the substrate 21, and the insulation layer 23 is formed between the first electrode layers 22. Furthermore, the photocatalyst containing layer 24 is formed on the entire surface of the first electrode layer 22 and the insulation layer 23, and the light emitting layers (the red light emitting layer 26R, the green light emitting layer 26G and the blue light emitting layer 26B) are formed in a pattern. Then, the second electrode layer 27 is formed on the light emitting layers 26R, 26G and 26B, and the photocatalyst containing layer 24.

What is claimed is:

1. An organic electroluminescent element comprising:
   a substrate;
   a first electrode layer formed on the substrate;
   an organic electroluminescent layer formed on the first electrode layer; and
   a second electrode layer formed on the organic electroluminescent layer,
      wherein a photocatalyst containing layer containing a photocatalyst, a characteristic providing agent, and a light emission characteristic improving material having a function of improving an activation of the photocatalyst and a light emission characteristic of the organic electroluminescent layer so as to have a characteristic of the characteristic providing agent changed by an action of the photocatalyst accompanied by an energy irradiation is formed at any position between the substrate and the second electrode layer; and
      the light emission characteristic improving material is a silver salt of a fluorine or a silver salt of an acid selected from the group consisting of phenols, enols, thiophenols, imides, oximes, clathrate compounds, a chloric acid and a perchloric acid.

2. A photocatalyst containing coating solution for forming an organic electroluminescent element comprising:
   a photocatalyst;
   a characteristic providing agent; and
   a light emission characteristic improving material having a function of improving an activation of the photocatalyst and a light emission characteristic of an organic electroluminescent layer, wherein the light emission characteristic improving material is a silver salt of a fluorine or a silver salt of an acid selected from the group consisting of phenols, enols, thiophenols, imides, oximes, clathrate compounds, a chloric acid and a perchloric acid.

* * * * *